(12) United States Patent
Chen et al.

(10) Patent No.: US 9,823,307 B2
(45) Date of Patent: Nov. 21, 2017

(54) SWITCHED RELUCTANCE MOTOR DOUBLE-SWITCH POWER CONVERTER THAT IDENTIFIES FAULT OF A NODE USING NODE ENERGY ANALYSIS

(71) Applicant: CHINA UNIVERSITY OF MINING AND TECHNOLOGY, Jiangsu (CN)

(72) Inventors: Hao Chen, Jiangsu (CN); Xing Wang, Jiangsu (CN)

(73) Assignee: CHINA UNIVERSITY OF MINING AND TECHNOLOGY, Jiangsu (CN)

( * ) Notice: Subject to any disclaimer, the term of this patent is extended or adjusted under 35 U.S.C. 154(b) by 231 days.

(21) Appl. No.: 14/430,381

(22) PCT Filed: Apr. 19, 2013

(86) PCT No.: PCT/CN2013/074455
§ 371 (c)(1),
(2) Date: Mar. 23, 2015

(87) PCT Pub. No.: WO2014/121557
PCT Pub. Date: Aug. 14, 2014

(65) Prior Publication Data
US 2015/0331050 A1 Nov. 19, 2015

(30) Foreign Application Priority Data
Feb. 5, 2013 (CN) .......................... 2013 1 0045221

(51) Int. Cl.
*G01R 31/34* (2006.01)
*G01R 31/42* (2006.01)

(52) U.S. Cl.
CPC ............. *G01R 31/34* (2013.01); *G01R 31/42* (2013.01)

(58) Field of Classification Search
CPC ...... G01R 31/42; G01R 31/34; G01R 31/343; H02P 25/092
See application file for complete search history.

(56) References Cited

U.S. PATENT DOCUMENTS 8,872,455 B2 * 10/2014 Tremel ............. H02M 7/53871
318/400.22
9,316,682 B1 * 4/2016 Chen ..................... G01R 31/34

FOREIGN PATENT DOCUMENTS

CN 101551441 A 10/2009
CN 101666858 A 3/2010
(Continued)

*Primary Examiner* — Bryan Bui
(74) *Attorney, Agent, or Firm* — Hoffmann & Baron, LLP

(57) ABSTRACT

A node energy diagnosis method for a fault of a switched reluctance motor double-switch power converter. By detecting a transient value of a phase current of a switched reluctance motor double-switch power converter, a node energy standard deviation σ is calculated to be used as a fault characteristic quantity, and a main switch lower-tube short-circuit fault of the switched reluctance motor double-switch power converter is diagnosed by adopting a node energy standard deviation σ curve of the phase current of the switched reluctance motor double-switch power converter in the whole rotation speed range. It also can be applied in fault diagnosis when a main switch lower-tube short-circuit fault occurs in two phases or more than two phases of a switched reluctance motor double-switch power converter. It is applicable to switched reluctance motor power converters with various phase numbers and a double-switch structure, is durable, reliable in fault diagnosis and good in effect, and has good practicability, and wide application prospect.

9 Claims, 2 Drawing Sheets

(56) References Cited

FOREIGN PATENT DOCUMENTS

| | | | |
|---|---|---|---|
| CN | 101839957 | A | 9/2010 |
| JP | 2005102384 | A | 4/2005 |
| JP | 2005151664 | A | 6/2005 |

\* cited by examiner

SWITCHED RELUCTANCE MOTOR DOUBLE-SWITCH POWER CONVERTER THAT IDENTIFIES FAULT OF A NODE USING NODE ENERGY ANALYSIS

This application is the U.S. National Phase of, and Applicant claims priority from, International Patent Application Number PCT/CN2013/074455 filed Apr. 19, 2013, which claims priority from CN 201310045221.6 filed Feb. 5, 2013, each of which is incorporated herein by reference.

FIELD OF THE INVENTION

The present invention relates to a node energy-based diagnosis method for fault of switched reluctance motor double-switch power converter, which is especially applicable to switched reluctance motor power converters with various phase numbers and double-switch structure.

BACKGROUND OF THE INVENTION

Accurate diagnosis for fault of switched reluctance motor power converter, on one hand, is depending on the information source of the fault, i.e., obtaining rich, authentic, and accurate fault information and symptoms is a prerequisite for the fault diagnosis; on the other hand, is depending on the fault diagnosing method. Therefore, to carry out fault diagnosis, not only rich, valid, and accurate fault information and data must be acquired, but also an advanced and efficient fault diagnosing method based on the limited fault data must be used, so as to accurately judge the fault type and accomplish fault diagnosis. Among existing fault diagnosing methods for the main circuit of switched reluctance motor switch converter, some utilize two fault characteristic quantities to identify a fault; while others utilize analog to digital conversion to extract fault characteristic quantities; all these methods have high requirements for hardware performance. An appropriate diagnosing method for fault of switched reluctance motor power converter, which is highly fault-targeted, can realize reliable and accurate fault diagnosis, and is highly practical, is an important guarantee for implementing fault-tolerant control of a switched reluctance motor system and for improving operating reliability of the switched reluctance motor system.

SUMMARY OF THE INVENTION

The object of the present invention is to provide a diagnosing method for fault of switched reluctance motor double-switch power converter, which is based on analysis of the dispersion of wavelet packet node energy.

The object of the present invention is attained through the follows:

detecting the transient value of phase current i(t) of switched reluctance motor double-switch power converter; calculating the standard deviation σ of node energy with formula $$\sigma = \left\{ \sum_{n=1}^{8} [E(5, j) - s]^2 / 8 \right\}^{1/2},$$

wherein, the mean value of node energy is $$s = \sum_{j=1}^{8} E(5, j)/8,$$

the node energy is $$E(5, j) = \int |S(5, j)(t)| dt = \sum_{k=1}^{n} |d_5^{j,n}|^2,$$

(j=0,1,2,3,4,5,6,7,8), the number of nodes is j, wherein S(5,j) represents the node j in layer 5, and $d_5^{j,n}$(j=0,1,2,3,4,5,6,7,8,n=1,2,3, . . . ,) represents the wavelet packet coefficients of S(5,j);

taking the standard deviation σ of node energy as a fault characteristic quantity, and diagnosing whether there is any fault in the main circuit of switched reluctance motor double-switch power converter;

if the standard deviation σ of node energy in the entire range of rotation speed is greater than 29.0, then there is a main switch lower tube short circuit fault in switched reluctance motor double-switch power converter;

If the standard deviation σ of node energy in the entire range of rotation speed is not greater than 29.0, then there is no main switch lower tube short circuit fault in switched reluctance motor double-switch power converter.

Beneficial effects: with the technical scheme described above, the transient value of phase current of switched reluctance motor double-switch power converter is detected, the standard deviation σ of node energy is calculated and taken as a fault characteristic quantity, and whether there is a main switch lower tube short circuit fault in switched reluctance motor double-switch power converter is diagnosed with a curve of standard deviation σ of phase current node energy in switched reluctance motor double-switch power converter in the entire range of rotation speed, and thereby the object of the present invention is attained. The diagnosis method for fault of switched reluctance motor power converter is applicable to switched reluctance motor power converter with various phase numbers and a double-switch structure, and is highly fault-targeted, can realize reliable and accurate fault diagnosis, is highly practical, and has high practicability and wide application prospects.

DETAILED DESCRIPTION OF THE EMBODIMENTS

Figure 1:
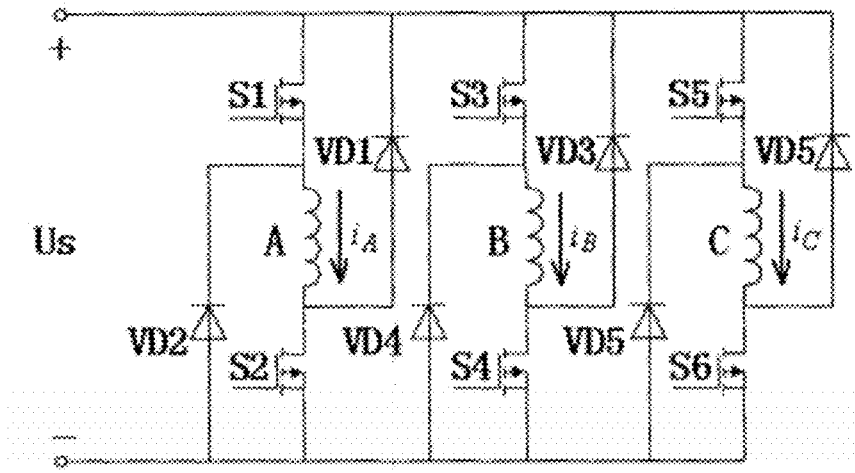
FIG. 1 is a structural diagram of the three-phase double-switch type switched reluctance motor power converter for which the present invention is applied.

Hereunder the present invention will be further detailed in an embodiment, with reference to the accompanying drawings:

As shown in FIG. 1, in the main circuit of the three-phase double-switch switched reluctance motor power converter, each phase has two main switches and two freewheel diodes; for example, in phase A, one end of an upper main switch S1 is connected to the positive electrode of the power supply Us, the other end of the upper main switch S1 is connected to one end of the winding of phase A, one end of the lower main switch S2 is connected to the negative electrode of the power supply Us, the other end of the lower main switch S2 is connected to the other end of the winding of phase A, one end of the upper freewheel diode VD1 is connected to the positive electrode of the power supply Us, the other end of the upper freewheel diode VD1 is connected to the other end of the winding of phase A, one end of the lower freewheel diode VD2 is connected to the negative electrode of the power supply Us, and the other end of the lower freewheel diode VD2 is connected to one end of the winding of phase A. The internal connections in phase B and phase C are similar to those in phase A. The phase A, B, and C are connected in parallel with the power supply Us.

First, the transient value of phase current $i_A$ of phase A of three-phase double-switch switched reluctance motor power converter is detected; then, the standard deviation $\sigma_A$ of node energy is calculated with formula $$\sigma_A = \left\{ \sum_{n=1}^{8} [E(5,j) - s]^2 / 8 \right\}^{1/2},$$

wherein, the mean value of node energy is $$s = \sum_{j=1}^{8} E(5,j)/8,$$

the node energy is $$E(5,j) = \int |S(5,j)(t)| dt = \sum_{k=1}^{n} |d_5^{j,n}|^2,$$

Figure 2:
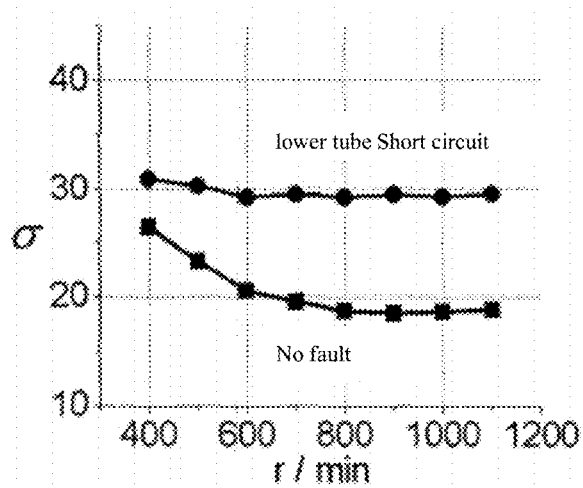
FIG. 2 is a curve diagram of standard deviation σ of phase current node energy in the three-phase double-switch type switched reluctance motor power converter for which the present invention is applied.
Figure 3:
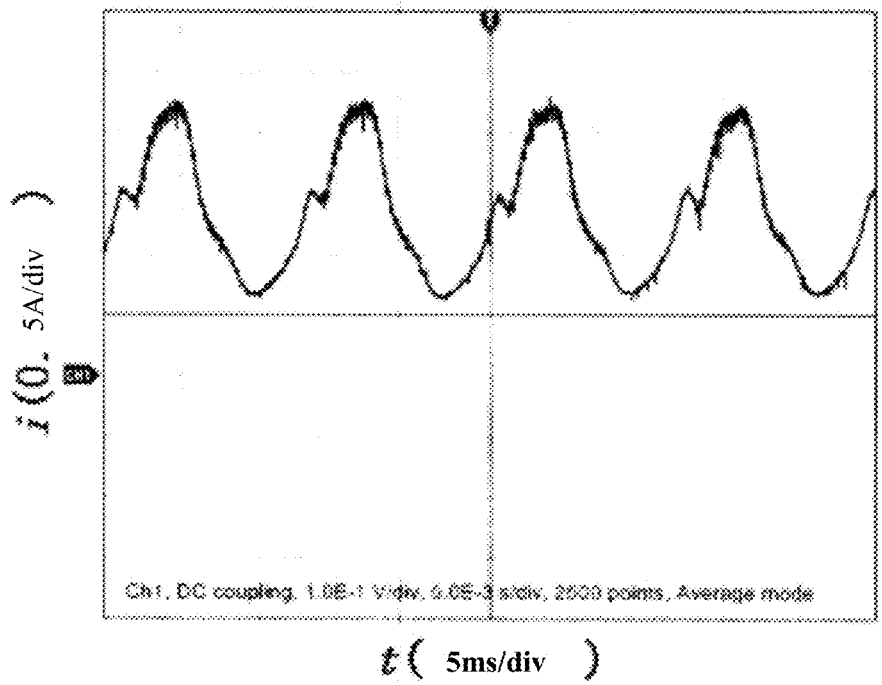
FIG. 3 is a diagram of phase current waveform of the three-phase double-switch switched reluctance motor power converter with main switch lower tube short circuit fault.
Figure 4:
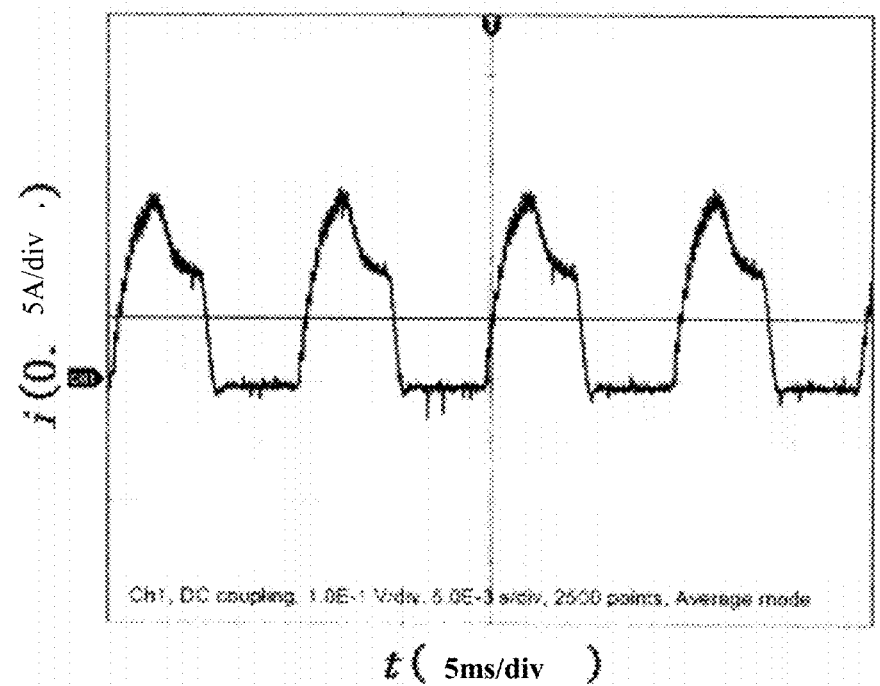
FIG. 4 is a diagram of phase current waveform of the three-phase double-switch switched reluctance motor power converter without fault.

(j=0,1,2,3,4,5,6,7,8), the number of nodes is j, wherein S(5,j) represents the node j in layer 5, and $d_5^{j,n}$(j=0,1,2,3,4,5,6,7,8,n=1,2,3,...,) represents the wavelet packet coefficients of S(5,j) of phase current $i_A$ of phase A;

the standard deviation $\sigma_A$ of node energy is taken as a fault characteristic quantity, and whether there is any fault in the main circuit of power converter is diagnosed;

As shown in FIG. 2, if the standard deviation $\sigma_A$ of node energy in the entire range of rotation speed is greater than 29.0, then there is main switch lower tube S2 short circuit fault in phase A of switched reluctance motor double-switch power converter; the phase current waveform is shown in FIG. 3;

As shown in FIG. 2, if the standard deviation $\sigma_A$ of node energy in the entire range of rotation speed is not greater than 29.0, then there is no main switch lower tube S2 short circuit fault in phase A of switched reluctance motor double-switch power converter; the phase current waveform is shown in FIG. 4;

As for detecting phase B of switched reluctance motor double-switch power converter for main switch lower tube S4 short circuit fault, the fault detection, fault type identification, and fault phase locating method thereof are similar to that for phase A of switched reluctance motor double-switch power converter;

As shown in FIG. 1, detecting the transient value of current $i_B$ of phase B of the three-phase double-switch switched reluctance motor power converter; calculating the standard deviation $\sigma_B$ of node energy with formula $$\sigma_B = \left\{ \sum_{n=1}^{8} [E(5,j) - s]^2 / 8 \right\}^{1/2};$$

if the standard deviation $\sigma_B$ of node energy in the entire range of rotation speed is greater than 29.0, then there is main switch lower tube S4 short circuit fault in phase B of switched reluctance motor double-switch power converter; if the standard deviation $\sigma_B$ of node energy in the entire range of rotation speed is not greater than 29.0, then there is no main switch lower tube S4 short circuit fault in phase B of switched reluctance motor double-switch power converter.

As for detecting phase C of switched reluctance motor double-switch power converter is detected for main switch lower tube S6 short circuit fault, the fault detection, fault type identification, and fault phase locating method thereof are similar to that for phase A of switched reluctance motor double-switch power converter;

As shown in FIG. 1, detecting the transient value of current $i_C$ of phase C of three-phase double-switch switched reluctance motor power converter; calculating the standard deviation $\sigma_C$ of node energy with formula $$\sigma_C = \left\{ \sum_{n=1}^{8} [E(5,j) - s]^2 / 8 \right\}^{1/2};$$

if the standard deviation $\sigma_C$ of node energy in the entire range of rotation speed is greater than 29.0, then there is main switch lower tube S6 short circuit fault in phase C of switched reluctance motor double-switch power converter; if the standard deviation $\sigma_C$ of node energy in the entire range of rotation speed is not greater than 29.0, then there is no main switch lower tube S6 short circuit fault in phase C of switched reluctance motor double-switch power converter.

As for detecting the switched reluctance motor power converter for lower tube short circuit fault in two or more phases, the fault detection, fault type identification, and fault locating method thereof are similar to the method described above;

The fault phases can be located by detecting the phase current of phase A, B, and C and judging whether the standard deviation $\sigma_A$, $\sigma_B$, and $\sigma_C$ of node energy are greater than 29.0 or not, respectively.

Detecting the transient values of phase current $i_A$, $i_B$, and $i_C$ of phases A, B, and C of the three-phase double-switch switched reluctance motor power converter respectively, and calculating the standard deviations $\sigma_A$, $\sigma_B$, and $\sigma_C$ of phase current node energy of phases A, B, and C respectively; if all the standard deviations $\sigma_A$, $\sigma_B$, and $\sigma_C$ of phase current node energy of phases A, B, and C are not greater than 29.0 in the entire range of rotation speed, then there is no main switch lower tubes S2, S4, or S6 short circuit faults in double-switch switched reluctance motor power converter; if the standard deviation $\sigma_A$ of phase current node energy of phase A, the standard deviation $\sigma_B$ of phase current node energy of phase B, and the standard deviation $\sigma_C$ of phase current node energy of phase C in the entire range of rotation speed are all greater than 29.0, then there are main switches lower tubes S2, S4, and S6 short circuit faults in the switched reluctance motor double-switch power converter; if the standard deviation $\sigma_A$ of phase current node energy of phase A and the standard deviation $\sigma_B$ of phase current node energy of phase B are greater than 29.0 in the entire range of rotation speed, then there are main switches lower tubes S2 and S4 short circuit faults in the switched reluctance motor double-switch power converter; if the standard deviation $\sigma_A$ of phase current node energy of phase A and the standard deviation $\sigma_C$ of phase current node energy of phase C in the entire range of rotation speed are greater than 29.0, then there are main switches lower tubes S2 and S6 short circuit faults in the switched reluctance motor double-switch power converter; if the standard deviation $\sigma_B$ of phase current node energy of phase B and the standard deviation $\sigma_C$ of phase current node energy of phase C are greater than 29.0 in the entire range of rotation speed, then there are main switches lower tubes S4 and S6 short circuit faults in the switched reluctance motor double-switch power converter.

The invention claimed is:

1. A switched reluctance motor power converter with a double-switch structure, the converter comprising:
 a multi-node circuit, the converter implementing operations associated with identifying a location and a type of fault in at least a portion of a node of the multi-node circuit using node energy analysis, the operations comprising:
  detecting a transient value of phase current associated with a node of the multi-node circuit of the switched reluctance motor power converter, the transient value being associated with a node energy value;
  determining a standard deviation of the node energy value associated with the node based at least on an analysis of a mean value of the node energy value and wavelet packet coefficients of the transient value of the phase current associated with the node of the multi-node circuit;
  analyzing a fault characteristic quantity using the standard deviation of the node energy value, the fault characteristic quantity associated with identification of a fault in at least a portion of the node of the multi-node circuit;
  determining if the standard deviation of the node energy in the entire range of rotation speed is greater than a pre-determined threshold value, the determination being indicative of a presence of fault in at least the portion of the node associated with the switched reluctance motor power converter; and
  determining if the standard deviation of the node energy in the entire range of rotation speed is not greater than the pre-determined threshold value, the determination being indicative of absence of fault in at least the portion of the node.

2. The switched reluctance motor power converter of claim 1, wherein a standard deviation of node energy a is identified based on $$\sigma = \left\{ \sum_{n=1}^{8} [E(5, j) - s]^2 / 8 \right\}^{1/2}.$$

3. The switched reluctance motor power converter of claim 1, wherein a mean value of the node energy is identified based on $$s = \sum_{j=1}^{8} E(5, j)/8.$$

4. The switched reluctance motor power converter of claim 3, wherein the node energy is defined as $$E(5, j) = \int |S(5, j)(t)| dt = \sum_{k=1}^{n} |d_5^{j,n}|^2, (j = 0, 1, 2, 3, 4, 5, 6, 7, 8).$$

5. The switched reluctance motor power converter of claim 4, wherein a number of nodes is j, wherein S(5,j) represents node j in layer 5, and wavelet packet coefficients of S(5,j) is based on $d_5^{j,n}$ (j=0,1,2,3,4,5,6,7,8,n=1,2,3, . . . ,).

6. The switched reluctance motor power converter of claim 1, wherein the pre-determined threshold value is 29.

7. The switched reluctance motor power converter of claim 1, wherein the fault is a short circuit fault in the at least a portion of the node.

8. The switched reluctance motor power converter of claim 1, wherein the location of the fault is identified in the at least a portion of the node.

9. The switched reluctance motor power converter of claim 8, wherein the location of the fault is identified in a main switch associated with the at least a portion of the node.

* * * * *